United States Patent
Barends

(10) Patent No.: US 10,217,057 B2
(45) Date of Patent: Feb. 26, 2019

(54) REMOVING LEAKAGE IN A QUANTUM BIT

(71) Applicants: Google LLC, Mountain View, CA (US); Rami Barends, Mountain View, CA (US)

(72) Inventor: Rami Barends, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 15/771,106

(22) PCT Filed: Oct. 29, 2015

(86) PCT No.: PCT/US2015/057984
§ 371 (c)(1),
(2) Date: Apr. 26, 2018

(87) PCT Pub. No.: WO2017/074379
PCT Pub. Date: May 4, 2017

(65) Prior Publication Data
US 2018/0314967 A1 Nov. 1, 2018

(51) Int. Cl.
*H03K 3/38* (2006.01)
*G06N 99/00* (2019.01)
*H01L 27/18* (2006.01)

(52) U.S. Cl.
CPC ........... *G06N 99/002* (2013.01); *H01L 27/18* (2013.01); *H03K 3/38* (2013.01)

(58) Field of Classification Search
USPC ....................................................... 327/528
See application file for complete search history.

(56) References Cited

U.S. PATENT DOCUMENTS

| | | | |
|---|---|---|---|
| 9,589,236 B1 * | 3/2017 | Abdo | H01P 3/08 |
| 9,735,776 B1 * | 8/2017 | Abdo | G06N 99/002 |
| 9,806,711 B1 * | 10/2017 | Abdo | H03K 17/92 |
| 9,818,064 B1 * | 11/2017 | Abdo | G01R 29/0814 |
| 10,056,908 B2 * | 8/2018 | Rigetti | G01R 33/02 |
| 2002/0106084 A1 * | 8/2002 | Azuma | B82Y 10/00 |
| | | | 380/263 |

(Continued)

OTHER PUBLICATIONS

International Preliminary Report on Patentability issued in International Application No. PCT/US2015/057984, dated May 11, 2018, 8 pages.

(Continued)

*Primary Examiner* — Adam Houston
(74) *Attorney, Agent, or Firm* — Fish & Richardson P.C.

(57) ABSTRACT

Apparatus and methods for removing leakage from a qubit. In one aspect, an apparatus includes one or more qubits, wherein each qubit facilitates occupation of at least one of a plurality of qubit levels, the qubit levels including two computational levels and one or more non-computational levels that are each higher than the computational levels, wherein the qubit facilitates transitions between qubit levels associated with a corresponding transition frequency; a cavity, wherein the cavity defines a cavity frequency; one or more couplers coupling each qubit to the cavity; one or more couplers coupling the cavity to an environment external to the one or more qubits and the cavity; a frequency controller that controls the frequency of each qubit such that, for each qubit, the frequency of the qubit is adjusted relative to the cavity frequency such that a population of a non-computational level is transferred to the cavity.

32 Claims, 5 Drawing Sheets

(56) References Cited

U.S. PATENT DOCUMENTS

| | | | |
|---|---|---|---|
| 2014/0326902 A1* | 11/2014 | Tahan | H01L 49/006 250/493.1 |
| 2016/0079968 A1* | 3/2016 | Strand | H01L 39/2493 327/528 |
| 2016/0343934 A1* | 11/2016 | Chang | H01L 39/025 |
| 2016/0364653 A1* | 12/2016 | Chow | G06N 99/002 |
| 2017/0005255 A1* | 1/2017 | Dial | H01L 39/24 |
| 2017/0039481 A1* | 2/2017 | Abdo | G06N 99/002 |
| 2017/0062692 A1* | 3/2017 | Dial | H01P 1/205 |
| 2017/0089961 A1* | 3/2017 | Abdo | G01V 8/005 |
| 2017/0133336 A1* | 5/2017 | Oliver | H01L 24/05 |
| 2017/0212860 A1* | 7/2017 | Naaman | G06F 13/4027 |
| 2017/0229632 A1* | 8/2017 | Abdo | H01L 39/2493 |
| 2017/0229633 A1* | 8/2017 | Abdo | H03K 17/92 |
| 2017/0373044 A1* | 12/2017 | Das | G06N 99/002 |
| 2018/0013052 A1* | 1/2018 | Oliver | H01L 25/0657 |
| 2018/0046933 A1* | 2/2018 | La Cour | G06F 13/364 |
| 2018/0102470 A1* | 4/2018 | Das | H01L 39/025 |
| 2018/0225586 A1* | 8/2018 | Chow | G06N 99/002 |
| 2018/0240033 A1* | 8/2018 | Leek | G06N 99/002 |
| 2018/0247974 A1* | 8/2018 | Oliver | G06N 99/002 |
| 2018/0260729 A1* | 9/2018 | Abdo | G06N 99/002 |
| 2018/0260730 A1* | 9/2018 | Reagor | G06N 99/002 |
| 2018/0260732 A1* | 9/2018 | Bloom | G06N 99/002 |
| 2018/0274900 A1* | 9/2018 | Mower | G06N 99/002 |

OTHER PUBLICATIONS

Martinis et al. "Fast Adiabatic qubit gates using only oz control," Phys. Rev. A. 90, 022307, Aug. 2014, 10 pages.

Reed et al. "Fast Reset and Suppressing Spontaneous Emission of a Superconducting Quibit," Appli. Phys. Lett. 96.20, May 2010, 4 pages.

Authorized officer Nicolas Douarche, International Search Report/Written Opinion in PCT/US2015/057984 dated Jul. 27, 2016, 12 pages.

Z. Chen et al: "Measuring and suppressing quantum state leakage in a superconducting qubit", Sep. 17, 2015 (Sep. 17, 2015), Retrieved from the Internet: URL:http://arxiv.org/abs/1509.05470v1, [retrieved on Sep. 21, 2015] the whole document.

J. S. Kelly: "Fault-tolerant 1-32 superconducting qubits". Dissertation for Ph.D. in Physics at University of California, Mar. 2015 (Mar. 2015), Retrieved from the Internet: URL:http://web.physics.ucsb.edu/marti ni sg roup/theses/Kelly2015.pdf [retrieved on May 14, 2015] the whole document.

S. E. Economou, E. Barnes: "Analytical 1-32 approach to swift nonleaky entangling gates in superconducting qubits". Physical Review B, vol. 91, Apr. 9, 2015 (Apr. 9, 2015), the whole document.

V. Vesterinen et a l : "Mitigating , 1-32 information leakage in a crowded spectrum of weakly anharmonic qubits". May 11, 2014 (May 11, 2014), Retrieved from the Internet: URL:https://arxiv.org/abs/1405.0450v2 1, [retrieved on May 13, 2014] the whole document.

R. Schutjens et al: "Single-qubit gates 1-32 in frequency-crowded transmon systems", Physical Review A, vol. 88, 052330, Nov. 25, 2013 (Nov. 25, 2013), the whole document.

J. M. Gambetta et al: "Analytic control 1-32 methods for high-fidelity unitary operations in a weakly nonlinear oscillator". Physical Review A, vol. 83, 012308, Jan. 18, 2011 (Jan. 18, 2011), the whole document.

* cited by examiner

REMOVING LEAKAGE IN A QUANTUM BIT

BACKGROUND

Removing the parasitic occupation of a quantum bit is a task in quantum computing, as well as other applications.

SUMMARY

This specification describes technologies relating to quantum hardware and methods for removing the parasitic occupation of higher levels, e.g., leakage, in a quantum bit (qubit) using a damped cavity mode, without requiring prior knowledge of the state of the quantum bit. By moving the quantum bit in frequency close to the damped cavity frequency, parasitic occupation of higher levels will transfer to the cavity. The parasitic occupation may be damped in the cavity using the damped cavity mode.

In general, one innovative aspect of the subject matter described in this specification can be embodied in methods that include the actions of accessing a quantum system that comprises one or more qubits, wherein each qubit facilitates occupation of at least one of a plurality of qubit levels, the qubit levels including two computational qubit levels and one or more non-computational qubit levels that are each higher than the computational qubit levels, and wherein the qubit facilitates transitions between qubit levels associated with a corresponding transition frequency; a cavity, wherein the cavity defines a cavity frequency; one or more couplers coupling each qubit to the cavity; and one or more couplers coupling the cavity to an environment external to the one or more qubits and the cavity; a frequency controller that controls the frequency of qubits such that, for each qubit that the frequency controller controls, the frequency of the qubit is adjusted relative to the cavity frequency such that a population of a non-computational level may be transferred to the cavity; and controlling the frequency of each qubit such that, for each qubit, the frequency of the qubit may be adjusted relative to the cavity frequency such that a population of a non-computational level may be transferred to the cavity.

The foregoing and other implementations can each optionally include one or more of the following features, alone or in combination. In some implementations, the method includes the actions of accessing a quantum system that comprises one or more qubits, wherein each qubit facilitates occupation of at least one of a plurality of qubit levels, the qubit levels including two computational qubit levels and one or more non-computational qubit levels that are each higher than the computational qubit levels, and wherein the qubit facilitates transitions between qubit levels associated with a corresponding transition frequency; a cavity, wherein the cavity defines a cavity frequency; one or more couplers coupling each qubit to the cavity; and one or more couplers coupling the cavity to an environment external to the one or more qubits and the cavity; a frequency controller that controls the frequency of qubits such that, for each qubit that the frequency controller controls, the frequency of the qubit is adjusted relative to the cavity frequency such that a population of a non-computational level is transferred to the cavity; and controlling the frequency of each qubit such that, for each qubit, the frequency of the qubit is adjusted relative to the cavity frequency such that a population of a non-computational level is transferred to the cavity.

In other implementations the method comprises, for each qubit: iteratively performing downward qubit level transitions until the lowest computational qubit level is reached, wherein performing a downward qubit level transition comprises: aligning the relevant qubit transition frequency to the cavity frequency; and waiting for a predetermined amount of time.

In some cases waiting for a predetermined amount of time causes population transfer to the cavity.

In other cases iteratively performing downward qubit level transitions until the lowest computational qubit level is reached for each qubit is performed in parallel for similar qubits.

In some implementations the predetermined amount of time is optimized to enable effective leakage removal.

In other implementations the method comprises, for each qubit: sweeping the qubit frequency past the cavity frequency.

In some implementations sweeping the qubit frequency past the cavity frequency performs downward qubit level transitions for qubits that are at or below a relevant qubit level.

In some cases the downward qubit level transitions are sequentially performed until the lowest computational qubit level is reached.

In some implementations sweeping the qubit frequency past the cavity frequency is performed in parallel for similar qubits.

In other implementations sweeping the qubit comprises: determining a qubit frequency trajectory relative to the cavity frequency; moving the qubit frequency according to the qubit frequency trajectory.

In some cases moving the qubit frequency according to the qubit frequency trajectory causes qubit transition frequencies to sequentially become aligned with the cavity frequency for population transfer to the cavity, and wherein the downward qubit level transitions are sequentially performed until the lowest computational qubit level is reached.

In some cases prior knowledge of the population of each of the qubit states is not needed.

In some cases the quantum system is provided for use in a quantum computation.

In some implementations the method is repeatedly performed after one or more computation operations in the quantum computation, wherein the final step of the computation operation is a measurement operation.

In some cases the method is repeatedly performed immediately before a measurement operation associated with one or more computation operations in the quantum computation.

In other implementations prior knowledge of the population of each of the qubit states is not needed.

The subject matter described in this specification can be implemented in particular embodiments so as to realize one or more of the following advantages.

In some examples, measuring the state of a quantum bit and feeding forward allows the quantum qubit to be set in a specific state. A major complication of such a process is that higher levels of the quantum bit can become populated during algorithmic operation. Higher levels of a quantum bit cannot be accurately read out and decay slowly, resulting in a significant occupation of quantum bit levels outside of the computational subspace, therefore hampering the implementation of quantum computation algorithms. A system removing leakage in a quantum bit using a damped cavity enables the reset of a multilevel quantum bit, thus reducing the occupation of higher level leaked states in quantum bits used in quantum computations and improving the efficiency and performance of such quantum computations.

A system removing leakage in a quantum bit using a damped cavity may include easily attainable qubit-cavity coupling strengths, e.g., of the order of 100 MHz, enabling an operation for removing leakage to be performed in several tens of nanoseconds. Therefore, the operation for removing leakage only adds a small overhead in time to a quantum computation that the quantum bit is participating in. A system removing leakage in a quantum bit using a damped cavity may therefore achieve improved computational efficiency compared to other methods for removing leakage in a quantum bit.

A system removing leakage in a quantum bit using a damped cavity may require less hardware components compared to other methods for removing leakage in a quantum bit. Whilst a separate cavity may be inserted in order to perform removal of leakage in a quantum bit, an existing readout resonator may be used to act as a damped cavity, since both a readout resonator and a damped cavity for leakage removal require strong coupling to the environment in order to allow for fast readout and damping.

A system removing leakage in a quantum bit using a damped cavity may achieve high levels of robustness and efficiency, since the duration, frequency and shape of the qubit trajectory that may be used to remove occupations of higher qubit levels can be optimized in a straightforward manner to enable effective leakage removal in a short timescale.

The details of one or more implementations of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

This specification describes an architecture and method for removing the occupation of higher levels in a quantum bit using a damped cavity, without requiring prior knowledge of the state of the qubit.

Generally, measuring the state of a qubit and applying transition pulses depending on that state, allows for a qubit to be set into a specific state. However, a major complication may be that higher levels of a qubit, such as the 2- and 3-states, can become populated during algorithmic operation. These higher levels cannot be accurately read out, and decay slowly. As a result, qubit levels outside of the computational subspace can accumulate significant occupation, hampering the implementation of procedures such as quantum error correction operations. This effect may especially be present in qubits with weak non-linearity where energy levels are close enough that they easily become populated.

An operation for removing the parasitic occupation of a qubit, e.g., performing a qubit reset, is therefore a critical element of qubit controllability and quantum hardware. This specification details two approaches for removing the occupation of higher levels in a qubit. Firstly, a stepped approach is described wherein each transition frequency is aligned with the cavity frequency. Secondly, a sweep approach is described wherein the qubit is swept in frequency past the cavity. Both approaches enable the population of the higher levels to be transferred to the cavity, where it is damped.

Example Operating Environment

Figure 1:
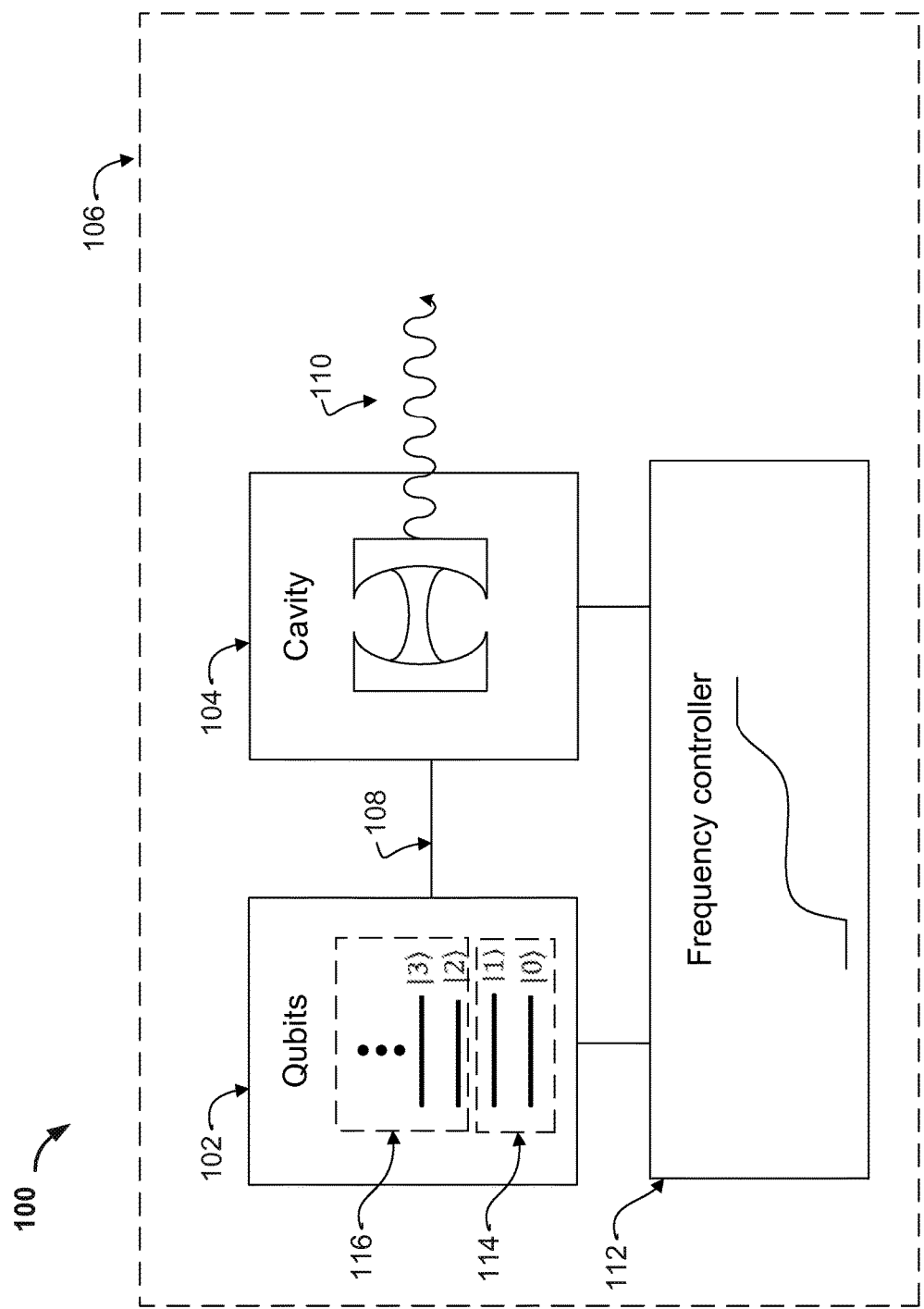
FIG. 1 depicts an example system for removing leakage in a qubit.

FIG. 1 depicts an example system 100 for removing leakage in a qubit. The system 100 includes one or more qubits 102, a frequency controller 112, and a cavity 104 that interacts with the one or more qubits 102, the frequency controller 112 and with an environment 106 that is external to the one or more qubits 102, the frequency controller 112 and the cavity 104.

The one or more qubits 102 each facilitate the occupation of at least one of a set of qubit levels. For example, if the one or more qubits are atoms the occupation of one of a set of qubit levels corresponds to an electron occupying the energy levels of the atom. The qubit levels include two computational qubit levels 114, e.g., levels 0- and 1-, and one or more non-computational levels 116 that are each higher than the computational qubit levels 114, e.g., levels 2- and 3-. These higher, non-computational levels generally decay slowly.

The one or more qubits 102 are frequency tunable and each facilitate transitions between qubit levels, e.g., transitions from level 3- to 2-, 2- to 1-, and 1- to 0-. Each transition between qubit levels may be associated with a corresponding transition frequency. In some implementations the one or more qubits 102 may exhibit weak non-linearity, where the qubit levels outside of the computational subspace can accumulate significant occupation. For example, in the case of weak non-linearity, the spacing between the qubit levels that are higher than the computational qubit levels may not change significantly, which may lead to non-negligible probabilities for transitions to such qubit levels. The one or more qubits 102 may include, but are not limited to, superconducting qubits or semiconducting qubits.

The one or more qubits 102 may be actively used to perform algorithmic operations or quantum computations. Population of the higher, non-computational qubit levels can, however, introduce errors in such operations or computations. For example, the occupation of qubit levels outside the computational subspace can hamper or prevent the implementation of quantum error correction operations. Therefore, the one or more qubits may require qubit reset operations wherein downward transitions between qubit levels are performed until the lowest qubit level is reached. Qubit reset operations are described in more detail below with reference to FIGS. 2 and 3.

Each of the one or more qubits 102 is coupled to the cavity 104 via a respective coupler, e.g., coupler 108. The respective couplers may, in principle, be any type of coupler, e.g., a capacitive coupler. A capacitive coupler may be achieved by placing an arm of a qubit and an end of a cavity in close proximity and using a claw-like coupler. The couplers that couple the one or more qubits 102 to the cavity 104 are controllable. For example, the strength of the couplers that couple the one or more qubits 102 to the cavity 104 may be frequency controllable. The couplers are controllable such that the capacitance may be fixed. The coupling may then be weakly dependent on frequency, and the interaction between the qubits and the cavity may be achieved by steering the qubit frequency towards or away from the cavity frequency.

The cavity 104 may be coupled to the environment 106 that is external to the one or more qubits 104 through one or more couplers, e.g., coupler 110. In some implementations the coupling of the cavity 104 to the environment 106 may be strong. The cavity 104 may be damped due to its interaction with the environment 106. For example, the coupling of the cavity 104 to the environment 106 may lead to decay, such as the decay into the vacuum modes from the excited state of the cavity at rate $\Gamma$ and the decay of the field mode of the cavity at rate $\kappa$. If the coupling is strong, that is $\Gamma$, $\kappa \gg g$, where g is the cavity-environment coupling constant, strong decay and no coherent evolution can be expected. If the coupling is weak, that is $\Gamma$, $\kappa \ll g$, coherent evolution dominates, for example until dephasing destroys the coherent evolution. The environment 106 may be formed by a wire which connects to a load. In some implementations the wire is a readout line.

The cavity 104 defines a cavity frequency. In some implementations the cavity 104 may be a separate cavity included in the system 100 for the purpose of removing leakage from the one or more qubits 104. In other implementations the hardware overhead may be reduced by allowing a readout resonator to act as the damped cavity.

The frequency controller 112 controls the frequency of each of the one or more qubits 102. The frequency controller 112 controls the frequency of each of the one or more qubits 102 such that, for each qubit, the frequency of the qubit may be adjusted relative to the cavity frequency and a population of a non-computational level may be transferred to the cavity.

The frequency controller 112 may be configured to determine a maximum relevant occupation level of each qubit. The frequency controller may also be configured to tune the transition frequencies of each qubit such that downward qubit level transitions are performed. For example, the frequency controller 112 may determine the 3-level as the maximum relevant occupational level of a qubit and perform downward qubit level transitions until the qubit is reset, e.g., the 0-level is reached. In order to perform a downward qubit level transition, e.g., a qubit level transition from the 3-level to the 2-level, the frequency controller may be configured to align the relevant qubit transition frequency, e.g., qubit transition frequency $f_{32}$, to the cavity frequency and maintain the alignment for a predetermined amount of time that causes a population transfer to the cavity, where it may be damped. Performing downward qubit level transitions using a frequency controller is described in more detail below with reference to FIGS. 2 and 3.

The frequency controller 112 may also be configured to sweep the frequencies of the one or more qubits past the cavity frequency to perform downward qubit level transitions. For example, the frequency controller 112 may determine the 3-level as the maximum relevant occupational level of a qubit and perform downward qubit level transitions by sweeping each qubit frequency past the cavity frequency until the qubit is reset. The frequency controller may be configured to sweep each qubit frequency past the cavity frequency by determining a respective qubit frequency trajectory relative to the cavity frequency such that qubit transition frequencies can sequentially become aligned with the cavity frequency for population transfer to the cavity, where it may be damped. The frequency controller may also be configured to move each qubit frequency according to the respective qubit frequency trajectory. The downward qubit level transitions are sequentially performed until the lowest computational qubit level is reached. Performing downward qubit level transitions using a frequency controller is described in more detail below with reference to FIGS. 2 and 3.

Removing Occupation from Higher Qubit Levels

Figure 2:
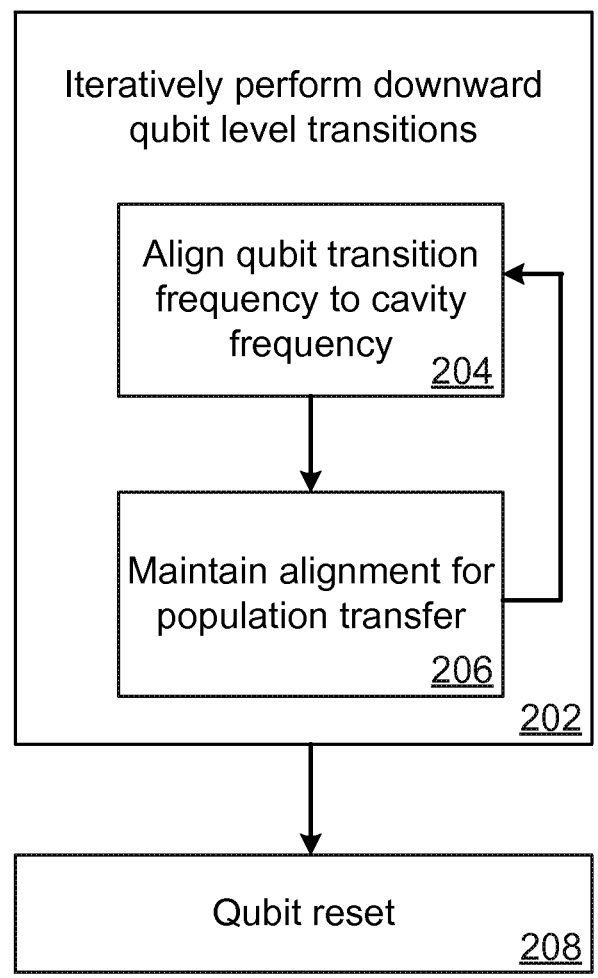
FIG. 2 is a flowchart of an example process for removing leakage in a qubit using a stepped approach.

FIG. 2 is a flowchart of an example process 200 for removing leakage in a qubit using a stepped approach. For example, the process 200 may be performed by the frequency controller 112 of system 100 described above with reference to FIG. 1. For convenience, the process 200 is described as removing leakage in a single qubit. However, the process 200 may be performed in parallel for systems that include multiple qubits.

The frequency controller iteratively performs downward qubit level transitions (step 202). In some implementations the frequency controller may determine a relevant maximum qubit level. The number of qubit levels may be large, therefore the frequency controller determines a relevant maximum qubit level that neglects any occupation of qubit levels above a threshold according to the system of interest. For example, the frequency controller may determine that the maximum qubit level is the 3-level, and that the qubit should be reset to the 0-level. The frequency controller will therefore iteratively perform downward qubit level transitions from the 3-level, that is perform transitions 3- to 2-, 2- to 1-, and 1- to 0-, for each qubit that is at or below a relevant qubit level, until the qubit is reset.

In order to perform the downward qubit level transitions, the frequency controller adjusts and aligns each respective qubit transition frequency to the cavity frequency (step 204). The frequency controller begins with the highest qubit level transition. For example, in order to perform a transition from the 3-level to the 2-level, the frequency controller aligns the transition frequency of the qubit $f_{32}$ to the cavity frequency.

The frequency controller maintains the alignment for population of the qubit level to transfer to the cavity (step 206). For example, the frequency controller may align the qubit transition frequency $f_{32}$ to the cavity frequency and maintain the alignment until the population of the 3-level may be transferred to the cavity. The frequency controller maintains the alignment of the qubit frequency to the cavity frequency for a predetermined amount of time. The predetermined amount of time may be a predetermined amount of time that has been optimized to enable effective leakage removal using standard optimization techniques e.g., simplex algorithms, gradient descent algorithms or Lagrangian methods. Once the population of the qubit level has transferred to the cavity, the frequency controller iteratively repeats steps (204) and (206) until all downward qubit level transitions have been performed.

The frequency controller achieves the reset of the qubit (step 208). Resetting a qubit using a damped cavity with a stepped approach is further described below with reference to FIG. 4. As described above with reference to FIG. 1, the quantum system implementing the process 200 described here may be active in or provided for use in a quantum computation. In such settings, steps (202) to (208) may be repeatedly performed immediately before or after one or more measurement operations associated with a computation operation in the quantum computation.

The process 200 does not require prior knowledge of the population of each of the qubit states. For example, if the process 200 is repeatedly performed immediately before a measurement operation associated with a computation operation in a quantum computation, the process can sequentially perform aligning from the determined maximum qubit level until the highest computational level may be reached. In this case, a 0-state would remain a 0-state, and a perfect 1-state would remain a 1-state. A qubit with occupations only in the computational levels 0- and 1- would not be affected. In another example, if the process 200 is repeatedly performed after a measurement operation associated with a computation operation in a quantum computation, the process may be robust even if the measurement operation associated with the computation operation misreports, or induces population in higher levels.

Figure 3:
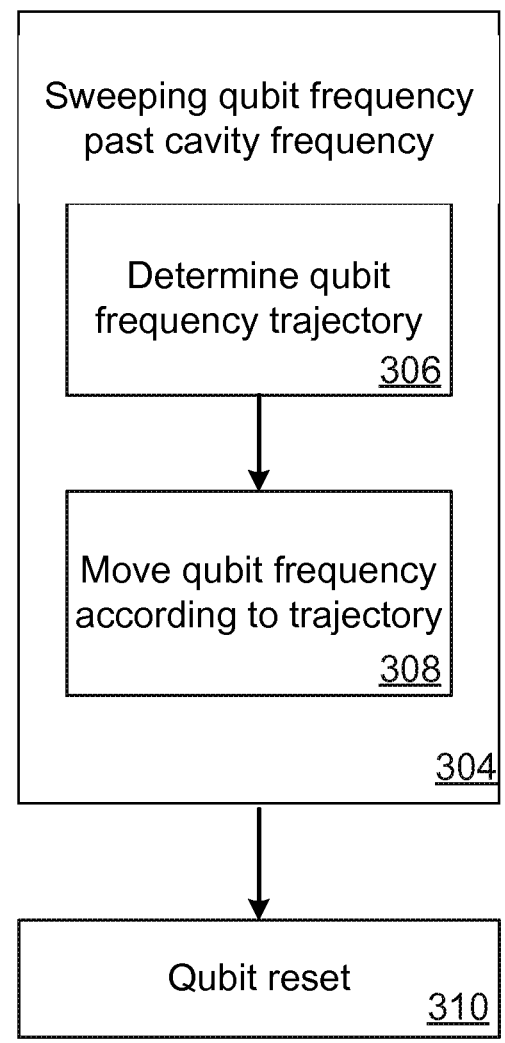
FIG. 3 is a flowchart of an example process for removing leakage in a qubit using a swept approach.

FIG. 3 is a flowchart of an example process 300 for removing leakage in a qubit using a swept approach. For example, the process 300 may be performed by the frequency controller 112 of system 100 described above with reference to FIG. 1. For convenience, the process 300 is described as removing leakage in a single qubit. However, the process 300 may be performed in parallel for systems that include multiple qubits.

The frequency controller sweeps the qubit frequency past the cavity frequency (step 302). In some implementations the frequency controller determines a maximum qubit level. The number of qubit levels may be large, therefore the frequency controller determines a relevant maximum qubit level that neglects any occupation of qubit levels above a threshold according to the system of interest. For example, the frequency controller may determine that the maximum qubit level is the 3-level, and that the qubit should be reset to the 0-level. The frequency controller will therefore sweep the qubit frequency past the cavity, moving the relevant energy levels close to the cavity frequency, until the lowest computational qubit level may be reached and the qubit is reset. This procedure may achieve high fidelity when the qubit-cavity coupling strength, expressed in frequency, is on the order of or exceeds the inverse of the sweep duration, and when the cavity damping rate is on the order of or exceeds the coupling strength, as discussed further below with reference to FIGS. 6 and 7.

In order to sweep the qubit frequency past the cavity frequency, the frequency controller determines a qubit frequency trajectory (step 304). The duration, frequency and shape of the qubit frequency trajectory may be determined using optimization techniques and optimal control theory that enable effective leakage removal in a short timescale. An example qubit frequency trajectory is described below with reference to FIG. 6.

The frequency controller moves the qubit frequency according to the determined qubit frequency trajectory (step 306). The frequency controller moves, or sweeps, the qubit frequency according to the determined qubit frequency trajectory, enabling the qubit transition frequencies to become sequentially aligned with the cavity frequency for population transfer to the cavity, where it may be damped. During the sweep, the downward qubit level transitions are sequentially performed until the lowest computational qubit level may be reached. The frequency controller may perform the sweep for each qubit that is at or below a relevant qubit level.

The frequency controller achieves the reset of the qubit (step 308). Resetting a qubit using a damped cavity with a swept approach is further described below with reference to FIGS. 5-7. As described above with reference to FIG. 1, the quantum system implementing the process 300 described here may be active in or provided for use in a quantum computation. In such settings, steps (304) to (308) may be repeatedly performed immediately before or after one or more measurement operations associated with a computation operation in the quantum computation.

The process 300 does not require prior knowledge of the population of each of the qubit states if the process 300 is performed after a measurement operation associated with a computation operation in a quantum computation. The process may be robust even if the measurement operation associated with the computation operation misreports, or induces population in higher levels. However, since the process 300 is a multi-level simultaneous swap, the process loses any qubit population in the non-computational higher levels as well as the excited computational level, e.g., the 1-level, thus destroying information of interest since the outcome of the measurement operation will always indicate the 0-state.

Figure 4:
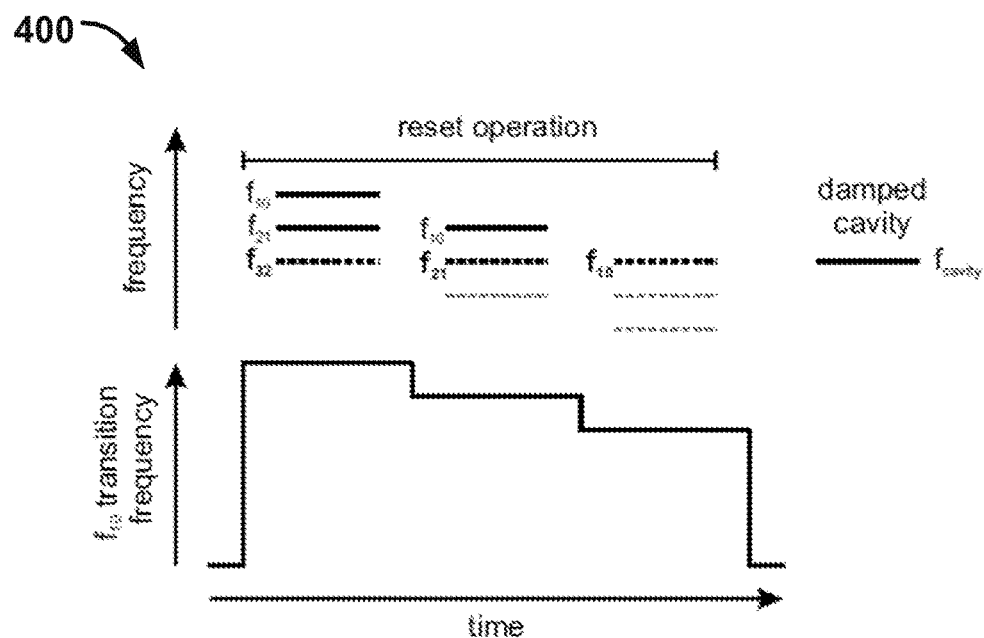
FIG. 4 is an illustration of an example qubit reset using a stepped approach.

FIG. 4 is an illustration 400 of an example qubit reset using a stepped approach. For example, the process 200 described above with reference to FIG. 2 may be used in order to perform the qubit reset. The illustration 400 shows an example qubit reset from a 3-level to the 0-level. As described above, qubit resets for qubits in other levels using a stepped approach may also be considered.

The qubit frequency f is plotted as a function of time t for the duration of the qubit reset operation. The qubit's 1-state to 0-state transition frequency $f_{10}$ follows a staircase pattern, reflecting the alignment of the distinct levels to the cavity frequency $f_{cavity}$. First, the 3-state to the 2-state transition frequency $f_{32}$ is aligned to the cavity frequency $f_{cavity}$, allowing the qubit to reach the second excited level. Next, the 2-state to the 1-state transition frequency $f_{21}$ is aligned to the cavity frequency $f_{cavity}$, allowing the qubit to reach the first excited level. This is followed by the aligning the 1-state to the 0-state transition frequency $f_{10}$ to the cavity frequency $f_{cavity}$, allowing the qubit to reach the ground state, resetting the qubit. The solid qubit transition frequency lines illustrate a possible occupied transition. The dashed grey lines illustrate emptied transitions. In the example illustration 400, for a qubit in the 0-, 1-. 2-, or 3-state, the end result is the ground state 0-. If levels above the 3-state need to be included, the reset process and illustration 400 would start with the transition frequencies of the relevant level.

Figure 5:
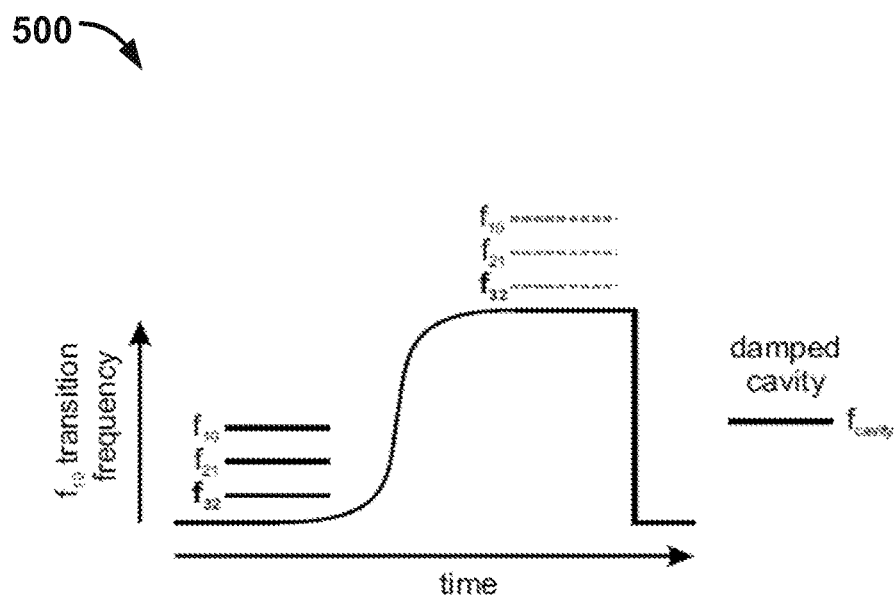
FIG. 5 is an illustration of an example qubit reset using a swept approach.

FIG. 5 is an illustration 500 of an example qubit reset using a swept approach. For example, the process 300 described above with reference to FIG. 3 may be used in order to perform the qubit reset. The illustration 500 shows an example qubit reset from a 3-level to the 0-level. As described above, qubit resets for qubits in other levels using a swept approach may also be considered.

The qubit transition frequency $f_{10}$ is plotted as a function of time t for the duration of a qubit reset operation. The relevant qubit transition frequencies are swept past the cavity, which is at frequency $f_{cavity}$, such that the relevant energy levels are aligned with the cavity frequency $f_{cavity}$. The solid qubit transition frequency lines illustrate a possible occupied transition. The dashed grey lines illustrate emptied transitions. A qubit reset using a swept approach such as that illustrated in FIG. 5 may be performed with high fidelity when the qubit-cavity coupling strength, expressed in frequency, is on the order of or exceeds the inverse of the sweep duration, and when the cavity damping rate is on the order of or exceeds the coupling strength. See FIGS. 6A and 6B below for more details.

In the example illustration 500, for a qubit in the 0-, 1-. 2-, or 3-state, the end result is the ground state 0-. If levels above the 3-state need to be included, the reset process and illustration 500 would include sweeping the said higher levels past the cavity. A qubit trajectory for performing a qubit reset using a swept approach is described in more detail below with reference to FIGS. 6A and 6B.

Figure 6B:
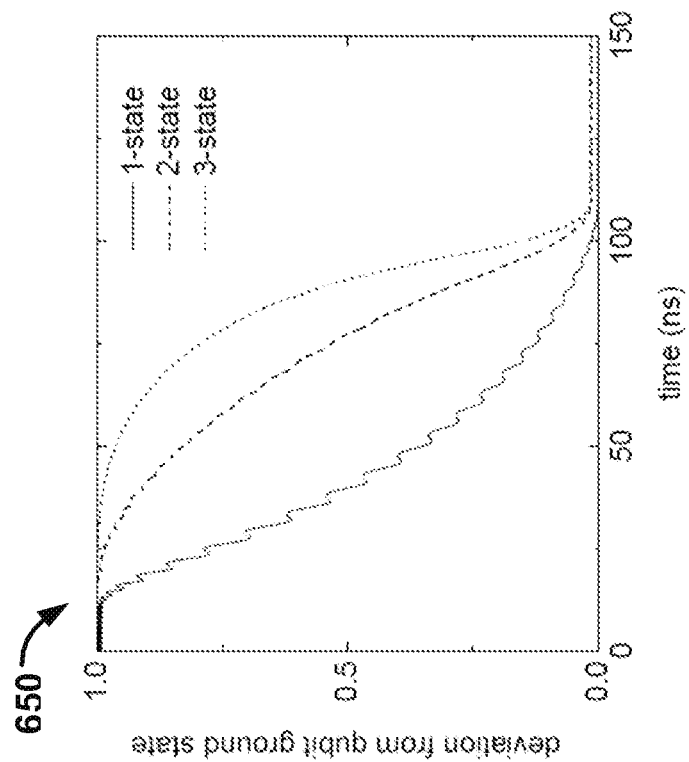
FIG. 6B depicts an example deviation from a qubit ground state as a function of time.
Figure 6A:
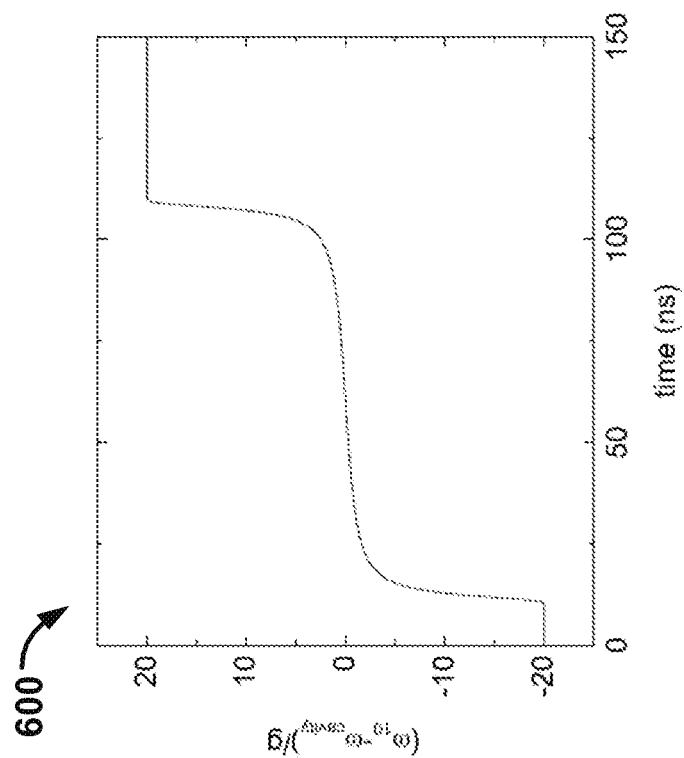
FIG. 6A depicts an example qubit trajectory.

FIG. 6A depicts an example qubit frequency trajectory 600 in a swept approach for removing leakage from a qubit. For example, the qubit frequency trajectory may correspond to a qubit frequency trajectory determined by the frequency controller 112 of FIG. 1 in step 306 of the example process 300 for removing leakage in a qubit using a swept approach, described with reference to FIG. 3.

The qubit frequency trajectory 600 is plotted relative to the cavity frequency in units of the qubit-cavity coupling strength g. The qubit frequency trajectory 600 illustrates that after moving the qubit frequency past the cavity, one can move the qubit frequency down to its starting frequency in a fast ramp. A parasitic exchange may occur, e.g., quanta may move back into the qubit, but this exchange may be a second order process for fast timescales, such as timescales that are of the order of $1/\kappa$ where $\kappa$ is the cavity damping rate, and can be minimized by a rapid ramp. However, if the ramp cannot be made fast enough, for example due to limitations of electronics, the process may continue by waiting for the cavity to depopulate.

FIG. 6B is an example plot 650 of deviation from a qubit ground state as a function of time. The plot 650 shows a deviation around 0.1% to 1% for the 1-, 2- and 3-state, where calculations were performed using a qubit-cavity coupling $g/2\pi=100$ MHz, cavity damping rate $\kappa=\frac{1}{25}$ ns and qubit nonlinearity 220 MHz. The simulation was performed using four resonator levels and four qubit levels.

Embodiments of the digital and/or quantum subject matter and the digital functional operations and quantum operations described in this specification can be implemented in digital electronic circuitry, suitable quantum circuitry or, more generally, quantum computational systems, in tangibly-embodied digital and/or quantum computer software or firmware, in digital and/or quantum computer hardware, including the structures disclosed in this specification and their structural equivalents, or in combinations of one or more of them. The term "quantum computational systems" may include, but is not limited to, quantum computers, quantum information processing systems, quantum cryptography systems, or quantum simulators.

Embodiments of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits, or a combination of one or more of them. Alternatively or in addition, the program instructions can be encoded on an artificially-generated propagated signal that is capable of encoding digital and/or quantum information, e.g., a machine-generated electrical, optical, or electromagnetic signal, that is generated to encode digital and/or quantum information for transmission to suitable receiver apparatus for execution by a data processing apparatus.

The terms quantum information and quantum data refer to information or data that is carried by, held or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL or Quipper.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers to be "configured to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof both.

The essential elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus, comprising:
   one or more qubits, wherein each qubit facilitates occupation of at least one of a plurality of qubit levels, the qubit levels including two computational qubit levels and one or more non-computational qubit levels that are each higher than the computational qubit levels, and wherein the qubit facilitates transitions between qubit levels associated with a corresponding transition frequency;
   a cavity, wherein the cavity defines a cavity frequency;
   one or more couplers coupling each qubit to the cavity; and
   one or more couplers coupling the cavity to an environment external to the one or more qubits and the cavity;
   a frequency controller that controls the frequency of qubits such that, for each qubit that the frequency controller controls, the frequency of the qubit is adjusted relative to the cavity frequency such that a population of a non-computational level is transferred to the cavity.

2. The apparatus of claim 1, wherein the frequency controller, for each qubit, is configured to:

iteratively perform downward qubit level transitions until a lowest computational qubit level is reached.

3. The apparatus of claim 2, wherein the frequency controller is configured to iteratively perform downward qubit level transitions for qubits that are at or below a relevant qubit level.

4. The apparatus of claim 2, wherein performing a downward qubit level transition comprises:
aligning the relevant qubit transition frequency to the cavity frequency; and
maintaining the alignment for a predetermined amount of time.

5. The apparatus of claim 4, wherein maintaining the alignment for the predetermined amount of time causes a population transfer to the cavity.

6. The apparatus of claim 1, wherein the frequency controller, for each qubit, is configured to:
sweep the qubit frequency past the cavity frequency.

7. The apparatus of claim 6, wherein the frequency controller is configured to sweep the qubit frequency past the cavity frequency to perform downward qubit level transitions for qubits that are at or below a relevant qubit level.

8. The apparatus of claim 7, wherein the downward qubit level transitions are sequentially performed until the lowest computational qubit level is reached.

9. The apparatus of claim 4, wherein sweeping the qubit comprises:
determining a qubit frequency trajectory relative to the cavity frequency;
moving the qubit frequency according to the qubit frequency trajectory.

10. The apparatus of claim 9, wherein moving the qubit frequency according to the qubit frequency trajectory causes the qubit transition frequencies to sequentially become aligned with the cavity frequency for population transfer to the cavity.

11. The apparatus of claim 1 wherein the environment is formed by a wire which connects to a load.

12. The apparatus of claim 11, wherein the wire is a readout line.

13. The apparatus of claim 1, wherein the cavity is a readout resonator.

14. The apparatus of claim 1, wherein the coupler coupling the cavity to the environment is strong.

15. The apparatus of claim 1, wherein the one or more qubits exhibit weak non-linearity.

16. A method, comprising:
accessing a quantum system that comprises:
one or more qubits, wherein each qubit facilitates occupation of at least one of a plurality of qubit levels, the qubit levels including two computational qubit levels and one or more non-computational qubit levels that are each higher than the computational qubit levels, and wherein the qubit facilitates transitions between qubit levels associated with a corresponding transition frequency;
a cavity, wherein the cavity defines a cavity frequency;
one or more couplers coupling each qubit to the cavity; and
one or more couplers coupling the cavity to an environment external to the one or more qubits and the cavity;
a frequency controller that controls the frequency of qubits such that, for each qubit that the frequency controller controls, the frequency of the qubit is adjusted relative to the cavity frequency such that a population of a non-computational level is transferred to the cavity; and
controlling the frequency of each qubit such that, for each qubit, the frequency of the qubit is adjusted relative to the cavity frequency such that a population of a non-computational level is transferred to the cavity.

17. The method of claim 16, wherein the method comprises, for each qubit:
iteratively performing downward qubit level transitions until the lowest computational qubit level is reached, wherein performing a downward qubit level transition comprises:
aligning the relevant qubit transition frequency to the cavity frequency; and
waiting for a predetermined amount of time.

18. The method of claim 17, wherein waiting for a predetermined amount of time causes population transfer to the cavity.

19. The method of claim 17, wherein iteratively performing downward qubit level transitions until the lowest computational qubit level is reached for each qubit is performed in parallel for similar qubits.

20. The method of claim 17, wherein the predetermined amount of time is optimized to enable effective leakage removal.

21. The method of claim 16, wherein the method comprises, for each qubit:
sweeping the qubit frequency past the cavity frequency.

22. The method of claim 21, wherein sweeping the qubit frequency past the cavity frequency performs downward qubit level transitions for qubits that are at or below a relevant qubit level.

23. The method of claim 22, wherein the downward qubit level transitions are sequentially performed until the lowest computational qubit level is reached.

24. The method of claim 21, wherein sweeping the qubit frequency past the cavity frequency is performed in parallel for similar qubits.

25. The method of claim 21, wherein sweeping the qubit comprises:
determining a qubit frequency trajectory relative to the cavity frequency;
moving the qubit frequency according to the qubit frequency trajectory.

26. The method of claim 25, wherein moving the qubit frequency according to the qubit frequency trajectory causes qubit transition frequencies to sequentially become aligned with the cavity frequency for population transfer to the cavity, and wherein the downward qubit level transitions are sequentially performed until the lowest computational qubit level is reached.

27. The method of claim 16, wherein prior knowledge of the population of each of the qubit states is not needed.

28. The method of claim 16, wherein the quantum system is provided for use in a quantum computation.

29. The method of claim 28, wherein the method is repeatedly performed after one or more computation operations in the quantum computation, wherein the final step of the computation operation is a measurement operation.

30. The method of claim 29, wherein prior knowledge of the population of each of the qubit states is not needed.

31. The method of claim 16, wherein the method is repeatedly performed immediately before a measurement operation associated with one or more computation operations in the quantum computation.

32. A method, comprising:
in response to performing a computation in a quantum system that comprises:
one or more qubits, wherein each qubit facilitates occupation of at least one of a plurality of qubit levels, the qubit levels including two computational qubit levels and one or more non-computational qubit levels that are each higher than the computational qubit levels, and wherein the qubit facilitates transitions between qubit levels associated with a corresponding transition frequency;
a cavity, wherein the cavity defines a cavity frequency; and
a frequency controller that controls the frequency of qubits such that, for each qubit that the frequency controller controls, the frequency of the qubit is adjusted relative to the cavity frequency such that a population of a non-computational level is transferred to the cavity;
controlling the frequency of each qubit that the frequency controller controls without prior knowledge of the population of the qubit levels such that, for each qubit that the frequency controller controls, the frequency of the qubit is adjusted relative to the cavity frequency such that a population of the non-computational level is transferred to the cavity.

* * * * *